United States Patent
Eroz et al.

(10) Patent No.: US 9,118,353 B2
(45) Date of Patent: Aug. 25, 2015

(54) SYSTEM AND METHOD FOR COMMUNICATING WITH LOW DENSITY PARITY CHECK CODES

(71) Applicant: Hughes Network Systems, LLC, Germantown, MD (US)

(72) Inventors: Mustafa Eroz, Germantown, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 14/601,182

(22) Filed: Jan. 20, 2015

(65) Prior Publication Data

US 2015/0149851 A1    May 28, 2015

Related U.S. Application Data

(63) Continuation of application No. 13/596,846, filed on Aug. 28, 2012, now Pat. No. 8,972,834.

(51) Int. Cl.
*H03M 13/00* (2006.01)
*H03M 13/11* (2006.01)

(52) U.S. Cl.
CPC ........ *H03M 13/6393* (2013.01); *H03M 13/005* (2013.01); *H03M 13/1102* (2013.01); *H03M 13/1137* (2013.01)

(58) Field of Classification Search
CPC ............ H03M 13/11; H03M 13/1137; H03M 13/1154; H03M 13/6362; H03M 13/6365; H03M 13/6393
USPC ................... 714/746, 752, 779, 790, 799–801
See application file for complete search history.

(56) References Cited

U.S. PATENT DOCUMENTS 5,805,642 A    9/1998    Wei et al.
5,838,728 A    11/1998   Alamouti et al.
(Continued)

FOREIGN PATENT DOCUMENTS

| EP | 1387496 A2 | 2/2004 |
| EP | 2365639 A2 | 9/2011 |
| WO | WO2004/006442 A1 | 1/2004 |

OTHER PUBLICATIONS

EPO, "Extended European Search Report", EPO App. No. 14171484.0.
(Continued)

*Primary Examiner* — Shelly A Chase
(74) *Attorney, Agent, or Firm* — Potomac Technology Law, LLC

(57) ABSTRACT

The present invention provides an approach for FEC encoding based on intermediate code block lengths not associated with any supported mother FEC code. A first string of $k_2$ data bits is received. The first string of data bits is encoded to generate an $N_2$ bit code block for transmission over a channel of a wireless communications network. The first data bit string is encoded based on a supported $(N_1, k_1)$ forward error correction (FEC) code of a code rate $R = k_1/N_1$, configured to encode a string of data bits of a length $k_1$ bits to generate a code block of a length $N_1$ bits. To facilitate the encoding of the first string of data bits based on the $(N_1, k_1)$ FEC code, the encoding comprises padding, repeating and/or puncturing the first string of data bits and a resulting $N_1$ bit code block to generate the $N_2$ bit code block.

14 Claims, 5 Drawing Sheets

(56) References Cited

U.S. PATENT DOCUMENTS

| | | |
|---|---|---|
| 5,844,943 A | 12/1998 | Kazecki et al. |
| 5,903,609 A | 5/1999 | Kool et al. |
| 6,023,783 A | 2/2000 | Divsalar et al. |
| 6,097,764 A | 8/2000 | McCallister et al. |
| 6,104,761 A | 8/2000 | McCallister et al. |
| 6,157,621 A | 12/2000 | Brown et al. |
| 6,370,669 B1 * | 4/2002 | Eroz et al. ............ 714/774 |
| 6,430,722 B1 | 8/2002 | Eroz et al. |
| 6,529,495 B1 | 3/2003 | Aazhang et al. |
| 6,674,811 B1 | 1/2004 | Desrosiers et al. |
| 6,724,813 B1 | 4/2004 | Jamal et al. |
| 6,829,308 B2 | 12/2004 | Eroz et al. |
| 6,940,827 B2 | 9/2005 | Li et al. |
| 6,963,622 B2 | 11/2005 | Eroz et al. |
| 7,020,829 B2 | 3/2006 | Eroz et al. |
| 7,039,126 B2 | 5/2006 | Galins |
| 7,173,978 B2 | 2/2007 | Zhang et al. |
| 7,187,728 B2 | 3/2007 | Seier et al. |
| 7,191,378 B2 | 3/2007 | Eroz et al. |
| 7,203,887 B2 | 4/2007 | Eroz et al. |
| 7,234,098 B2 | 6/2007 | Eroz et al. |
| 7,237,174 B2 | 6/2007 | Eroz et al. |
| 7,296,208 B2 | 11/2007 | Sun et al. |
| 7,324,613 B2 | 1/2008 | Fang et al. |
| 7,334,181 B2 | 2/2008 | Eroz et al. |
| 7,376,883 B2 | 5/2008 | Eroz et al. |
| 7,376,885 B2 | 5/2008 | Richardson et al. |
| 7,397,400 B2 * | 7/2008 | Miller ............... 341/67 |
| 7,398,455 B2 | 7/2008 | Eroz et al. |
| 7,424,662 B2 | 9/2008 | Eroz et al. |
| 7,430,396 B2 | 9/2008 | Sun et al. |
| 7,447,984 B2 | 11/2008 | Cameron et al. |
| 7,461,325 B2 | 12/2008 | Eroz et al. |
| 7,483,496 B2 | 1/2009 | Eroz et al. |
| 7,519,895 B2 | 4/2009 | Kyung et al. |
| 7,577,207 B2 | 8/2009 | Eroz et al. |
| 7,669,109 B2 | 2/2010 | Hocevar |
| 7,673,226 B2 | 3/2010 | Eroz et al. |
| 7,725,802 B2 | 5/2010 | Eroz et al. |
| 7,746,758 B2 | 6/2010 | Stolpman |
| 7,747,934 B2 * | 6/2010 | Livshitz ............ 714/800 |
| 7,770,089 B2 | 8/2010 | Eroz et al. |
| 7,856,586 B2 | 12/2010 | Eroz et al. |
| 7,864,869 B2 | 1/2011 | Eroz et al. |
| 7,954,036 B2 | 5/2011 | Eroz et al. |
| 7,962,830 B2 | 6/2011 | Eroz et al. |
| 8,028,224 B2 | 9/2011 | Eroz et al. |
| 8,069,393 B2 | 11/2011 | Eroz et al. |
| 8,095,854 B2 | 1/2012 | Eroz et al. |
| 8,102,947 B2 | 1/2012 | Eroz et al. |
| 8,126,076 B2 | 2/2012 | Sartori et al. |
| 8,140,931 B2 | 3/2012 | Eroz et al. |
| 8,144,801 B2 | 3/2012 | Eroz et al. |
| 8,145,980 B2 | 3/2012 | Eroz et al. |
| 8,156,400 B1 | 4/2012 | Yeo et al. |
| 8,166,367 B2 | 4/2012 | Myung et al. |
| 8,181,085 B2 | 5/2012 | Eroz et al. |
| 8,291,293 B2 | 10/2012 | Eroz et al. |
| 8,369,448 B2 | 2/2013 | Zhang et al. |
| 8,392,786 B2 | 3/2013 | Trachewsky et al. |
| 8,402,341 B2 | 3/2013 | Eroz et al. |
| 8,504,894 B1 | 8/2013 | Zeng et al. |
| 8,782,499 B2 | 7/2014 | Jeong et al. |
| 2003/0002593 A1 | 1/2003 | Galins |
| 2003/0021358 A1 | 1/2003 | Galins |
| 2003/0037298 A1 | 2/2003 | Eleftheriou et al. |
| 2004/0019845 A1 | 1/2004 | Eroz et al. |
| 2004/0054960 A1 | 3/2004 | Eroz et al. |
| 2004/0258177 A1 | 12/2004 | Shen et al. |
| 2005/0111590 A1 | 5/2005 | Fang et al. |
| 2006/0218459 A1 | 9/2006 | Hedberg |
| 2006/0224935 A1 | 10/2006 | Cameron et al. |
| 2008/0019263 A1 | 1/2008 | Stolpman |
| 2008/0313523 A1 | 12/2008 | Sun et al. |
| 2009/0158129 A1 | 6/2009 | Myung et al. |
| 2009/0164863 A1 | 6/2009 | Oh et al. |
| 2009/0187804 A1 | 7/2009 | Shen et al. |
| 2009/0187811 A1 | 7/2009 | Eroz et al. |
| 2009/0219849 A1 | 9/2009 | Alpert et al. |
| 2009/0282314 A1 * | 11/2009 | Djordjevic et al. ......... 714/755 |
| 2010/0100789 A1 | 4/2010 | Yu et al. |
| 2010/0122143 A1 | 5/2010 | Lee et al. |
| 2010/0211841 A1 | 8/2010 | Cao et al. |
| 2010/0241923 A1 | 9/2010 | Wang et al. |
| 2011/0051825 A1 | 3/2011 | Tao et al. |
| 2011/0138262 A1 | 6/2011 | Myung et al. |
| 2011/0164705 A1 | 7/2011 | Zhang et al. |
| 2011/0202820 A1 | 8/2011 | Eroz et al. |
| 2011/0239086 A1 | 9/2011 | Eroz et al. |
| 2013/0198581 A1 | 8/2013 | Lee et al. |
| 2013/0283131 A1 | 10/2013 | Tsatsaragkos et al. |
| 2014/0068375 A1 | 3/2014 | Eroz et al. |

OTHER PUBLICATIONS

Eroz, et al., "An Innovative Low-Density Parity-Check Code Design With Near-Shannon-Limit Performance and Simple Implementation", IEEE Transactions on Communications, vol. 54, No. 1, Jan. 1, 2006, XPOQ7902266, Jan. 1, 2006, 13-17.

Eroz, et al., "Structured Low-Density Parity-Check Code Design for Next Generation Digital Video Broadcast", Military Communications Conference, 2005, Oct. 17, 2005, XP010901536, Oct. 17, 2005, 1-6.

ESR P1064EP00, "European Search Report", EP 2365639 A3, Aug. 1, 2012.

ETSI EN 302 307 V1.2.1 (DVB), "ETSI EN 302 307 V1.2.1 Digital Video Broadcasting (DVB); Second generation framing structure, channel coding and modulation systems for Broadcasting, Interactive Services, News Gathering and other broadband satellite applications (DVB-S2)", ETSI EN 302 307 V1.2.1, Aug. 1, 2009, XP002678089, Aug. 1, 2009, 22-28, 37-49.

Hughes Network Systems, "DVB Part II: S2-Extensions (S2-X) Specification", XP017842249A, Oct. 21, 2013.

Hughes Network Systems, "DVB-S2 Annex M—S2-Extensions (S2-X) SPecification", XP017845061A, Oct. 7, 2013.

Hughes Network Systems, "DVB-S2 LDPC Codes for Very Low SNR Modes", XP017841241A, Jul. 22, 2013.

USPTO, "International Search Report & Written Opinion", PCT App. No. PCT/US2014/029939, Aug. 5, 2014.

* cited by examiner

SYSTEM AND METHOD FOR COMMUNICATING WITH LOW DENSITY PARITY CHECK CODES

RELATED APPLICATIONS

This application is a continuation, and claims the benefit of the earlier filing date under 35 U.S.C. §120, from U.S. patent application Ser. No. 13/596,846 (filed Aug. 28, 2012), the entire disclosure of which is incorporated herein by reference.

BACKGROUND

Forms of communication and data transmission make use of low-density parity-check codes (LDPC). LDPC codes are a form of linear error correcting code, which are used to transmit messages over a noisy transmission channel. When a transmitter uses an LDPC code to encode data, it encodes it in a redundant form. This redundancy allows the receiver to detect a limited number of errors that may occur anywhere in the message, and also allows the receiver to correct these errors without retransmission of data. LDPC codes are powerful block codes whose performances get close to Shannon capacity as their block size increases. As a result, efficient and high performing LDPC codes have been standardized by several standardization bodies, the first being DVB-S2. In DVB-S2 two different coded block sizes have been used: 64800 and 16200 bits. LPDC codes are finding increasing use in applications where reliable and highly efficient information transfer over bandwidth in the presence of data-corrupting noise. LPDC codes are currently utilized in digital video broadcasting, microwave communications, cell phone communications, and Wi-Fi.

FIG. 1 illustrates an example system 100. As illustrated in the figure system 100 includes a gateway 102, a user terminal 104, a user terminal 106, a user terminal 108, a user terminal 110, a user terminal 112, and the internet 114. User terminal 104 is arranged to send code blocks, which are 120 bits in length, to gateway 102 along bi-directional transmission line 116. User terminal 106 is arranged to send code blocks, which are 240 bits in length, to gateway 102 along bi-directional transmission line 118. User terminal 108 is arranged to send code blocks, which are 360 bits in length, to gateway 102 along bi-directional transmission line 120. User terminal 110 is arranged to send code blocks, which are 480 bits in length, to gateway 102 along bi-directional transmission line 122. User terminal 112 is arranged to send code blocks, which are 600 bits in length, to gateway 102 along bi-directional transmission line 124. For purposes of discussion, in this example, each user terminal is transmitting discrete code blocks of a certain length. In practice, each user terminal is operable to transmit a plurality of code block lengths, which are dependent on the amount of information to be transmitted.

Gateway 102 is arranged to send and receive data from, bi-directional transmission line 116 from user terminal 104, bi-directional transmission line 118 from user terminal 106, bi-directional transmission line 120 from user terminal 108, bi-directional transmission line 122 from user terminal 110, and bi-directional transmission line 124 from user terminal 112. Gateway 102 is additionally arranged to send encoded data stream 126 to internet 114. Gateway 102 contains a LDPC code and architecture for each respective code block length that it supports. In this example, gateway 102 contains an LDPC code and architecture set for each of the code block it supports, the lengths of which are 120 bits, 240 bits, 360 bits, 480 bits, and 600 bits.

In operation, a user will send code blocks to gateway 102 from a user terminal. Each individual user terminal encodes the data with an LDPC encoder and then sends the encoded data blocks to gateway 102. When gateway 102 receives the encoded LDPC code blocks, it decodes them using an LDPC decoder to obtain the originally transmitted data. Note that when gateway 102 wants to send data to a user terminal the process is reversed. When gateway 102 wants to send data to a user terminal, it uses an LDPC encoder to encode the data. Once the data is encoded, the encoded code blocks are transmitted to a user terminal, which then decodes the code blocks to obtain the originally transmitted data. Once the data is encoded, it may be sent to internet 112 via internet connection 126.

Data being sent over a noisy channel needs to be sent in a secure form. When a transmission channel is noisy it is much easier to lose data during transmission. This can create difficulties because of transmission control protocol (TCP). Each data packet that is sent has a sequence number that is used to reconstruct the transmitted data in the correct order. For successful communication, the reliability of each packet (i.e. robustness against the channel noise) needs to be similar.

Another difficulty to consider during data transmission is that of power consumption. The larger a data packet is, the less energy per bit is consumed during transmission. This is due to the fact that the performance of modern error correcting codes, such as LDPC or turbo codes, improves with increasing block size. For very large data streams it becomes very important to try and minimize energy consumption. For example, if a user wants to send a data stream that is 120,000 bits long, it would be much more efficient to send 20 packets that are 6000 bits in length than it would be to send 3000 packets that are 40 bits in length.

Data streams that are being transmitted first need to be configured into a data stream length that is supported be the receiver it is being sent to. This will be further illustrated by FIGS. 2-4B.

FIG. 2 illustrates an example of various data stream lengths as well as supported data stream lengths of system 200. As illustrated in the figure system 200 includes data stream sizes that are integer multiples of 120 bits. Data stream 202, data stream 206, data stream 212, data stream 222, and data stream 230 represent the data stream lengths that are supported by the system hardware. Data stream 202 through data stream 230 represents all possible incoming data stream lengths. Note that it is possible of for an incoming data stream to exceed the possible supported data stream size but for the purposes of discussion there is a cut off at 1800 bits represented by data stream 230.

FIG. 3A and FIG. 3B illustrates the transmission of a data stream size that is not supported by the receiver hardware. As illustrated in FIGS. 3A-3B system 300 includes supported data stream 222, data stream length 224, a data packet 326 and a data packet 328. Supported data stream length 222 is the length of 11 data packets, each of which is 120 bits in length. Data stream 224 is comprised of 12 individual data packets, data packet 302 through data packet 324, each of which is 120 bits in length. Data packet 326 is a packet that can hold 11 data packets each of which are 120 bits in length. Data packet 328 is a packet that can hold 11 data packets each of which are 120 bits in length. In operation, data stream 224 needs to be converted into a data stream, of two or more pieces, with lengths that can be put into data packets that are supported by the receiver hardware. Since data stream 224 is too long to fit into data packet 322, it needs to be divided up into smaller lengths that will fit into a supported data packet size that will then be transmitted. The division of data stream 224 into smaller lengths to fit into supported data packet sizes will be further discussed in reference to FIG. 3B.

FIG. 3B illustrates an example data stream that has been divided into smaller stream lengths that can fit into data packets which are supported by the receiver hardware. In operation, data stream 224 has been divided into two lengths, which are small enough to fit into supported data packet 326 and data packet 328, both of which are the same length as supported data packet 222. Data packet 326 is filled with data packet 302 through data packet 322 from data stream 224 leaving data packet 324 left over. Data packet 328 contains data packet 324 from data stream 224 but is otherwise empty. Since a data packet can't be sent unless it is full, the open space is filled with dummy bits. Dummy bits do not affect the content of data packet 328; they are simply placed in data packet 328 to fill it so it may be transmitted. At this point, data stream 224 has been divided into two smaller lengths that have been put into data packet 326 and data packet 328, and they are ready to be transmitted to the receiver.

FIG. 4A and FIG. 4B illustrate the transmission of a data stream length that is not supported by receiver hardware. As illustrated in FIGS. 4A-4B system 400 includes supported data stream length 206, data stream 224, a data packet 402, a data packet 404, a data packet 406, and a data packet 408. Supported data stream length 206 is the length of 3 data packets, each of which is 120 bits in length. Data stream 224 is comprised of 12 individual data packets, data packet 302 through data packet 324, each of which is 120 bits in length. Data packet 402, data packet 404, data packet 406, and data packet 408 can each hold 3 packets of data, each of which are 120 bits in length. In operation, data stream 224 needs to be converted into a data stream lengths that can be put into packet sizes that are supported by the receiver hardware. Since data stream 224 is too long to fit into data packet 402, it needs to be divided up into smaller lengths that will fit into a supported data packet size that will then be transmitted. The division of data stream 224 into smaller lengths to fit into supported data packet sizes will further be discussed in reference to FIG. 4B.

FIG. 4B illustrates an example data stream that has been divided into smaller stream lengths which are able to fit into data packet which are supported by the receiver hardware. In operation, data stream 224 has been divided into 4 equal lengths, each of which are small enough to fit into data packet 402, data packet 404, data packet 406, or data packet 408. Each data packet is filled with information from data stream 224. Once data packet 402, data packet 404, data packet 406, and data packet 408 are filled with information from data stream 224, they are ready to be transmitted to the receiver.

There are several problems with the current methods when utilizing LDPC codes. The first problem is that of large block size support as shown in FIGS. 3A-4B.

A code block may sometimes need to be very small and sometimes very large. If only a large block size was implemented, a lot of transmission capacity would be wasted when the user had only a small amount of data to send. Conversely, if only a small block size was implemented, more power would be used than necessary when the user had a large amount of data to send since the performance of iterative decoding systems improve as the block size increases. Even though a user may have an arbitrarily large amount of data to send occasionally, it would not be practically feasible to implement arbitrarily large block sizes. That's because the complexity of iterative receivers increases almost linearly with increasing block sizes. Another problem with the current methods of utilizing LDPC codes, is the lack of intermediate block size support as shown in FIG. 1. If one wants to support many different code block lengths that it may be undesirable to design a separate LDPC code for each block length. The final problem with the current methods for utilizing LDPC codes as shown in FIG. 1 is the space that is taken up by the architecture used for each LDPC code. If one wants to support many different code block lengths, an LDPC code and its respective architecture needs to be implemented in the hardware design for each individual code block length.

To support many different code block lengths, the architecture needed to support each individual code block length begins to be problematic. As the number of architectures being implemented for each code block length increases, the complexity of the hardware design increases as well. The increase in complexity, for each supported code block length, is too high when attempting to design hardware that is capable of supporting many code block lengths.

What is needed is a system and method to address the problem of large block size support. The transmitted block sizes need to be chosen so that the minimum transmitted size is maximized. This means that when a user wants to transmit more data than the maximum supported block size, the transmitted block sizes should be as large as possible without having empty space in the transmitted block.

What is needed is a system and method to address the problem of intermediate block size support. To address intermediate block size support, bits in the code should be shortened, punctured, and repeated to derive intermediate code block lengths. On the other hand, the location of punctured bits should be carefully chosen in order not to cause substantial performance loss. What is needed is a system and method for using common decoder architecture for different code rates and block sizes. It may also be desirable to use the same piece of hardware to decode all block sizes and all code rates with the help of a code-specific set of parameters. This will reduce the complexity of the receiver where a different decoder is used for different codes.

SOME EXAMPLE EMBODIMENTS

The present invention provides a system and method for supporting large block sizes. By choosing to transmit incoming data blocks such that, the minimum transmitted size is maximized, one can transmit blocks reliably and efficiently despite the original code block being too large to be supported. The present invention additionally provides a system and method for supporting intermediate block sizes. Through puncturing, shortening, and repeating incoming code blocks as indicated by a parity check matrix it is possible to create code blocks of an intermediate length. The present invention additionally provides a system and method for using common decoder architecture for different code rates and block sizes. By using a hardware architecture that is common to all code blocks, it is possible to support many different codes by running them through an iterative process utilizing the architecture common to all code blocks.

In accordance with example embodiments of the present invention, a method comprises receiving a first string of data bits of a length $k_2$ bits. The first string of data bits is encoded to generate a code block of a length $N_2$ bits for transmission over a channel of a wireless communications network. The first string of data bits is encoded based on a supported ($N_1$, $k_1$) forward error correction (FEC) code of a code rate $R=k_1/N_1$ configured to encode a string of data bits of a length $k_1$ bits to generate a code block of a length $N_1$ bits. To facilitate the encoding of the first string of data bits based on the ($N_1,k_1$) FEC code, the encoding comprises one or more of padding, repeating and puncturing the first string of data bits and a resulting $N_1$ bit code block to generate the $N_2$ bit code block.

By way of example, where $k_2<k_1$, the encoding comprises adding a number $x_1$ of pad bits to the first string of data bits to generate a second string of data bits of a length $k_1$, encoding the second string of data bits based on the $(N_1,k_1)$ FEC code to generate the resulting $N_1$ bit code block, and removing or puncturing bits from the $N_1$ bit code block to generate the $N_2$ bit code block. By way of further example, the removing or puncturing of bits from the $N_1$ bit code block comprises removing the $x_1$ pad bits from the $N_1$ bit code block and puncturing a number $x_2$ of bits from the $N_1$ bit code block to generate the $N_2$ bit code block. By way of further example, the number of pad bits removed from the $N_1$ bit code block, $x_1=k_1-k_2$, and the number of bits punctured from the $N_1$ bit code block, $x_2=N_1-x_1-N_2$. By way of further example, for an FEC code of a code rate R equal to one of the group consisting of 1/2, 2/3, 4/5, 3/4 and 5/6, the punctured bits are punctured from parity bits of the $N_1$ bit code block, and for an FEC code of a code rate R equal to one of the group consisting of 8/9 and 9/10, the punctured bits are punctured from data bits of the $N_1$ bit code block. By way of further example, the supported $(N_1,k_1)$ FEC code is a one of a plurality of supported FEC codes, each being a different $(N,k)$ code of a respective code rate $R=k/N$ configured to encode a string of data bits of a length k bits to generate a code block of a length N bits, and the length $k_2$ of the first string of data bits does not correspond to any of the supported FEC codes. In this context, the $(N_1,k_1)$ FEC code is selected as the one of the plurality of supported FEC codes with respect to which the length $N_1$ of the resulting $N_1$ bit code block reflects a bit length that is a next size larger than the length $N_2$ of the $N_2$ bit code block.

In accordance with further example embodiments of the present invention, an apparatus comprises an encoder. The encoder includes an input port configured to receive a string of input data bits. The encoder is configured to encode the string of input data bits to generate a resulting code block for transmission over a channel of a wireless communications network, and the encoder supports one or more forward error correction (FEC) codes, each supported FEC code being a different $(N,k)$ code of a respective code rate $R=k/N$ configured to encode a string of data bits of a length k bits to generate a code block of a length N bits. Further, in a case where the received string of information bits is of a length of $k_2$ bits, and the bit length $k_2$ does not correspond to any of the supported FEC codes, the encoder is configured to encode the received string of data bits to generate a code block of a length $N_2$ bits. The received string of data bits is encoded based on a one of the supported FEC codes $(N_1,k_1)$, of a code rate $R=k_1/N_1$ and configured to encode a string of data bits of a length $k_1$ bits to generate a code block of a length $N_1$ bits, and to facilitate the encoding of the received string of data bits based on the $(N_1,k_1)$ FEC code, the encoding comprises one or more of padding, repeating and puncturing the first string of data bits and a resulting $N_1$ bit code block to generate the $N_2$ bit code block.

By way of example, where $k_2<k_1$, and the encoding comprises adding a number $x_1$ of pad bits to the received string of data bits to generate a second string of data bits of a length $k_1$, encoding the second string of data bits based on the $(N_1,k_1)$ FEC code to generate the resulting $N_1$ bit code block, and removing or puncturing bits from the $N_1$ bit code block to generate the $N_2$ bit code block. By way of further example, The removing or puncturing of bits from the $N_1$ bit code block comprises removing the $x_1$ pad bits from the $N_1$ bit code block and puncturing a number $x_2$ of bits from the $N_1$ bit code block to generate the $N_2$ bit code block. By way of further example, the number of pad bits removed from the $N_1$ bit code block, $x_1=k_1-k_2$, and the number of bits punctured from the $N_1$ bit code block, $x_2=N_1-x_1-N_2$. By way of further example, for an FEC code of a code rate R equal to one of the group consisting of 1/2, 2/3, 4/5, 3/4 and 5/6, the punctured bits are punctured from parity bits of the $N_1$ bit code block, and for an FEC code of a code rate R equal to one of the group consisting of 8/9 and 9/10, the punctured bits are punctured from data bits of the $N_1$ bit code block. By way of further example, the encoder is further configured to select the $(N_1,k_1)$ FEC code as the one of the supported FEC codes with respect to which the length $N_1$ of the resulting $N_1$ bit code block reflects a bit length that is a next size larger than the length $N_2$ of the $N_2$ bit code block.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate an exemplary embodiment of the present invention and, together with the description, serve to explain the principles of the invention. In the drawings:

FIG. 7A illustrates a data stream length that is not supported by receiver hardware, and FIG. 7B illustrates an example data stream that has been divided into smaller stream lengths which are able to fit into data packets which are supported by the receiver hardware, in accordance with aspects of the present invention;

DETAILED DESCRIPTION

Figure 1:
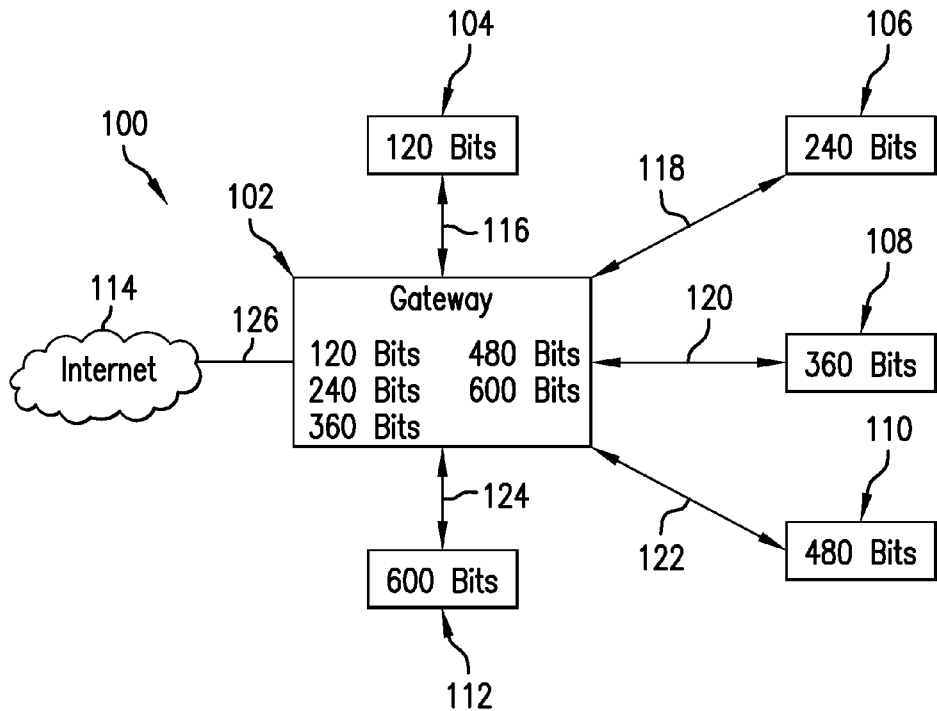
FIG. 1 illustrates an example gateway and user terminals for a prior art configuration.
Figure 2:
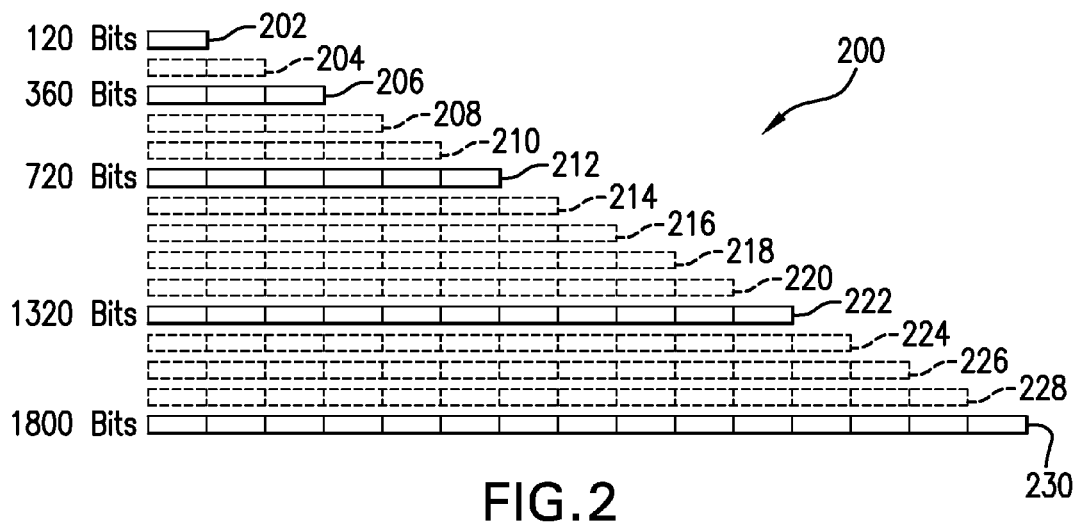
FIG. 2 illustrates various data stream lengths as well as supported data stream lengths.
Figure 3A:
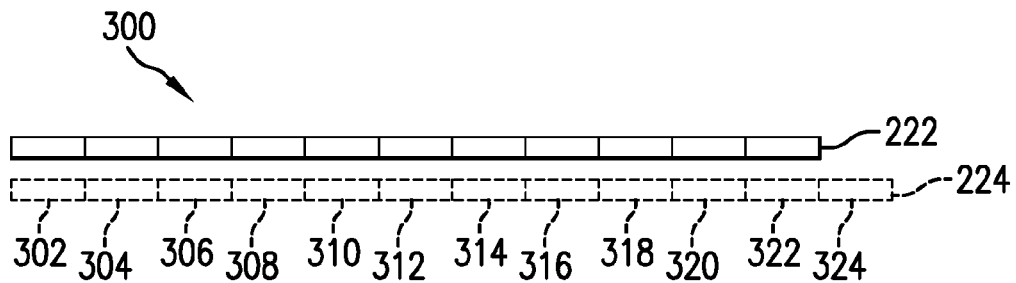
FIG. 3A illustrates the use of packets that are too large for a given data stream length that are not supported by receiver hardware.
Figure 3B:
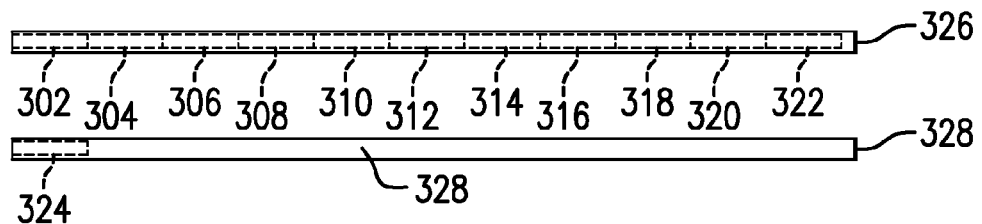
FIG. 3B illustrates an example data stream that has been divided into smaller stream lengths that can fit into data packets which are supported by receiver hardware, for the prior art of FIG. 1.
Figure 4A:
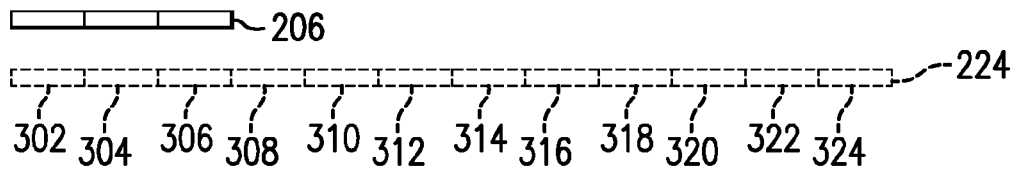
FIG. 4A illustrates a data stream length that is not supported by receiver hardware.
Figure 4B:
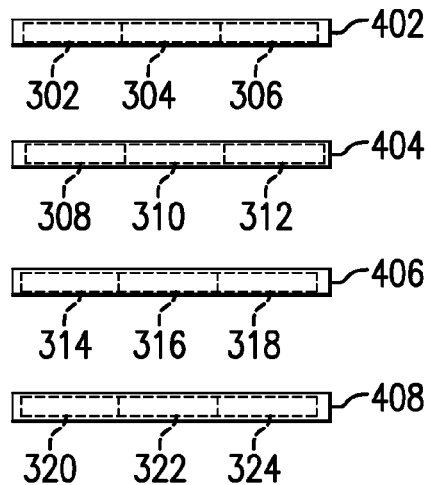
FIG. 4B illustrates the division of a data stream into many smaller lengths that are able to fit into data packets that are supported by receiver hardware, for the prior art of FIG. 1.

Aspects of the present invention provide a method for supporting large code block lengths. In contrast with the embodiment of FIGS. 2-4B, code blocks that are larger than the supported code block length available are broken up into small pieces in such a way that the minimum transmitted size is maximized.

In contrast to the prior art system described above, where the code blocks were either broken up into many small pieces or pieces of random length, and were then sent out to a receiver. These two methods were unreliable and inefficient.

Now the code blocks are now broken up into the largest possible size that can be transmitted without having wasted space. The intelligent decision to choose the block size to be transmitted such that they are as large as possible without having empty space, optimizes reliability and efficiency.

Choosing large block sizes exploits the fact that power is more efficiently utilized when sending large block sizes. Additionally, this decision can provide the desired degree of reliability for successful transmission of code blocks.

Aspects of the present invention provide a method for supporting intermediate code block lengths. Practical LDPC codes of interest have structured parity check matrices, therefore their storage is relatively easier than random parity check matrices. On the other hand, in some applications, the number of desired parity check matrices may be so large that designing a separate LDPC codes for each block size may be undesirable.

In these cases, it may be possible to design a certain number of mother parity check matrices and derive the intermediate codes by shortening, puncturing or repeating. Provided the number of shortened, punctured or repeated bits is not excessive with respect to the original block size, performance loss would not be significant by carefully choosing the location of the affected bits.

The general rule provided, in accordance with aspects of the present invention, states that for lower code rates such as 1/2, 2/3 and 4/5 punctured bits should be chosen among the parity bits, whereas for high code rates such as 8/9 and 9/10, punctured bits should be chosen among the systematic bits to minimize the performance loss.

Aspects of the present invention provide a method for using common decoder architecture for different code rates and block sizes. As previously discussed, in prior art system 100, the current method for supporting many different code block lengths adds an undesired amount of complexity to a system.

Currently, a separate LDPC code and piece of architecture is implemented to support each different code block length and code rate, while not problematic when supporting a limited number of code blocks, designs become extremely complex when attempting to support many code blocks.

The present invention provides a method for finding a common decoder architecture, and then using the architecture to support all the code blocks.

A fully parallel LDPC decoder implementation would have as many bit nodes as the number of coded bits and as many check nodes as the number of parity check equations. While this implementation would have very high speeds, it would be extremely complex. Moreover it may need to have as many instantiations of the decoder as the number of parity check matrices that would be implemented.

A more practical approach may be to implement a partially parallel decoder where a certain number M of physical parallel engines would process M logical nodes of the LDPC codes at a time. This approach not only simplifies the decoder significantly, but also allows to support all of the different parity check matrices using a common decoder hardware, provided the same inherent structure is kept among all of the codes. Only a code specific table would change whenever a new parity check matrix is deployed. This table would tell the decoder parallel engines where to access the relevant edges for the logical nodes being processed.

The number of parallel engines M influences the decoder speed and complexity, and it is determined by the code design. When a set of different parity check matrices is supported with a common hardware, the number of physical nodes has to be as large as the maximum M among all of the codes. Therefore in order not to waste the decoder area for certain codes, M for different parity check matrices should be as close to one another as possible.

The first two aspects of the present invention will now be described in greater detail with reference to FIGS. 5-8.

In accordance with the first aspect, an encoder is provided to encode a string of information bits having a bit length k into a string of encoded bits having a bit length N. The encoder includes a plurality of LDPC portions. Each LDPC portion can encode a portion of the information bits into a LDPC code block, respectively, wherein each of the respective LDPC code blocks has a different bit length. The encoder additionally includes a controller that can instruct a number of the LDPC portions to encode the information bits into a plurality of LDPC code blocks such that the minimum encoded block size is maximized.

For example, suppose for purposes of discussion that an encoder in accordance with second aspect of the present invention includes a controller that instructs an encoder to encode a string of information bits using an LDPC portion. For purposes of discussion, presume that in this example that the string of information bits has a length k=6720 bits. If the largest LDPC portion is only 5760 bits, the string of information bits must be broken into two separate pieces. The controller will determine the optimum LDPC portion to be used to encode the information bits based on performance considerations.

In this example, the controller would instruct an LDPC portion that was 3360 bits in length to encode the string of information bits. This choice would minimize the amount of dummy bits that were needed to fill each code block while simultaneously minimizing the amount of power needed to transmit each bit after being encoded.

In accordance with the second aspect, an encoder is provided to encode a string of information bits having a bit length k into a string of encoded bits having a bit length N. The encoder includes an LDPC portion and a controller. The LDPC portion can encode the information bits into LDPC code blocks, each of which has a bit length $S_1$. When $N<S_1$, the LDPC portion can pad, shorten, puncture or repeat a bit within one of the string of information bits and parity bits associated with the string of information bits to create an encoded LDPC code block having a length N.

For example, returning to FIG. 2, suppose for purposes of discussion that an encoder in accordance with second aspect of the present invention includes a first LDPC portion that can encode information bits into LDPC code blocks corresponding to data stream length 222 (in this case data stream length 222 corresponds to $S_1$). In accordance with the present invention, if a data stream length corresponding to data stream length 220 (in this case data stream length 220 corresponds to N, in which $N<S_1$) were needed to be encoded, then LDPC portion would be able to pad, shorten, puncture or repeat a bit within one of the string of information bits and parity bits associated with the string of information bits in data stream length 220 to create an encoded LDPC code block having a length corresponding to data stream length 222 (in this case data stream length 222 corresponds to $S_1$).

Figure 5:
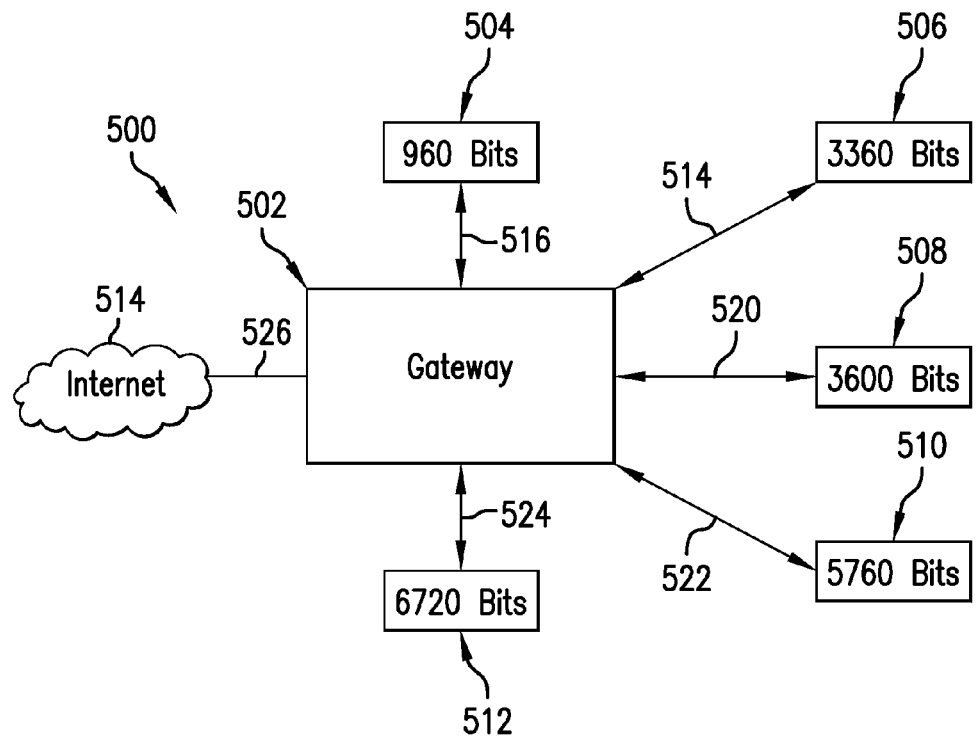
FIG. 5 illustrates an example gateway and user terminal configuration, in accordance with aspects of the present invention.

FIG. 5 illustrates an example system 500 in accordance with aspects of the present invention.

As illustrated in the figure system 500 includes a gateway 502, a user terminal 504, a user terminal 506, a user terminal 508, a user terminal 510, a user terminal 512, and the internet 514.

User terminal 504 is arranged to send code blocks, which are 960 bits in length, to gateway 502 along bi-directional transmission line 516.

User terminal 506 is arranged to send code blocks, which are 3360 bits in length, to gateway 502 along bi-directional transmission line 518.

User terminal 508 is arranged to send code blocks, which are 3600 bits in length, to gateway 502 along bi-directional transmission line 520.

User terminal 510 is arranged to send code blocks, which are 5760 bits in length, to gateway 502 along bi-directional transmission line 522.

User terminal 512 is arranged to send code blocks, which are 6720 bits in length, to gateway 502 along bi-directional transmission line 524.

For purposes of discussion, in this example embodiment, each user terminal is transmitting discrete code blocks of a certain length. In practice, each user terminal is operable to transmit a plurality of code block lengths, which are dependent on the amount of information to be transmitted.

Gateway 502 is arranged to send and receive data from, bi-directional transmission line 516 from user terminal 504, bi-directional transmission line 518 from user terminal 506, bi-directional transmission line 520 from user terminal 508, bi-directional transmission line 522 from user terminal 510, and bi-directional transmission line 524 from user terminal 512. Gateway 502 is additionally arranged to send encoded data stream 526 to Internet 514.

In operation, a user will send code blocks of a certain length to gateway 502. Each individual user terminal encodes the data with an LDPC encoder and sends the encoded blocks to gateway 502.

Gateway 502 contains architecture for each respective mother code that it supports. In this example, gateway 502 contains architecture for mother codes, the lengths of which are 960 bits, 3600 bits, and 5760 bits. Code blocks transmitted by UT1 504, UT3 506, and UT4 510 are able to be transmitted easily due to the fact that the code blocks are of a length that corresponds to a supported mother parity check matrix, and do not need to undergo any manipulation.

Code blocks from UT2 506 and UT5 512 are not of a length that is readily usable by gateway 502 and therefore have to be either shorten, punctured and repeated or padded to a length that corresponds to a mother parity check matrix which is further described with reference to FIG. 6.

When gateway 502 receives the encoded LDPC code blocks, it decodes them using an LDPC decoder that has a length that is common to all incoming code block lengths. The LDPC decoder runs an iterative process to decode each incoming code block of any length and obtain the originally transmitted data.

Note that when gateway 502 wants to send data to a user terminal the process is reversed. When gateway 502 wants to send data to a user terminal, it uses an LDPC encoder to encode the data. Once the data is encoded, the encoded code blocks are transmitted to a user terminal, which then decodes the code blocks to obtain the originally transmitted data.

Figure 6:
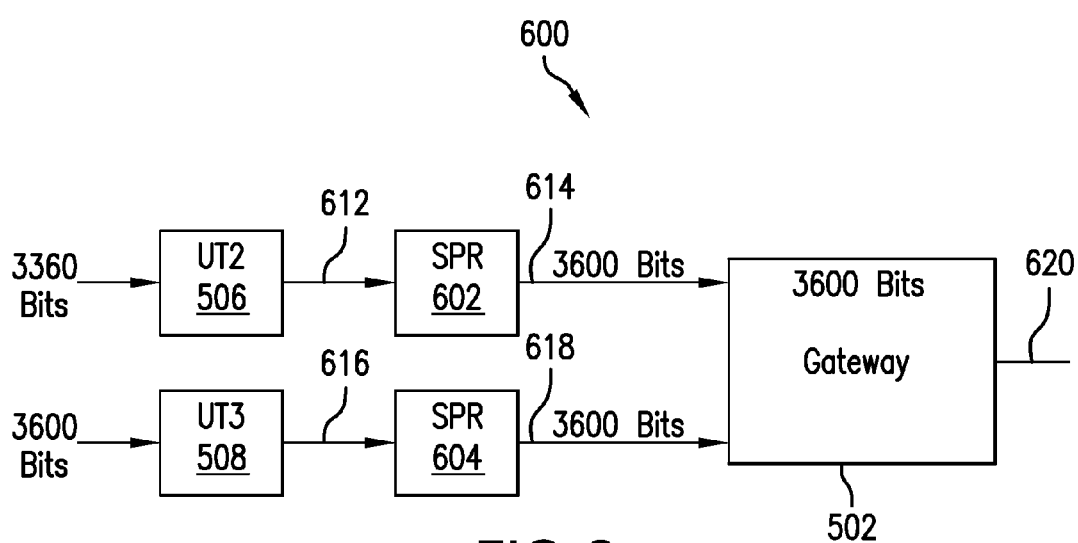
FIG. 6 illustrates the shortening, puncturing, and repeating of a code block, in accordance with aspects of the present invention.

FIG. 6 illustrates the shortening, puncturing, and repeating (SPR) of code block length to a length corresponding to a supported LDPC code by using a mother parity check matrix.

As illustrated in the figure, system 600 includes gateway 502, UT2 506, UT3 508, SPR portion 602, SPR portion 604.

UT2 506 is arranged to send data blocks, 3360 bits in length, to SPR portion 802. UT3 508 is arranged to send data blocks, 3600 bits in length, to SPR portion 604.

Gateway 502 is arranged to receive data blocks that are 3600 bits in length and to send data blocks 3600 bits in length to a receiver via Internet connection 620.

In operation, a user using UT3 508 will send data to a receiver (not shown). The code blocks that UT3 508 sends out are 3600 bits in length, which is received by SPR portion 604. SPR portion 604 has a list of LDPC codes, the code block length of the supported LDPC codes, and their mother parity check matrices used by gateway 502. In this example, the supported LDPC code is associated with a code block whose bit length is 3600.

SPR portion 604 will receive the code block sent by UT3 508 and cross-reference the code block length with code block lengths that are associated with the supported LDPC codes contained by gateway 502. In this case SPR portion 604 finds that the code block sent by UT3 508 is compatible with a LDPC code supported by gateway 502 and sends the code block to the gateway without any code block length manipulation.

Simultaneously, a user using UT2 506 will send data to a receiver (not shown). The code blocks that UT2 506 sends out are 3360 bits in length, which is received by SPR portion 602. SPR portion 602 has a list of code block sizes that are associated with LDPC codes supported by gateway 502. In this example, the supported block size is 3600 bits in length. The code block sent by UT2 506 is too small to be used by a mother LDPC code and the LDPC code for a code block 3360 bits in length must be derived from a supported mother parity check matrix by shortening, puncturing, and repeating.

When a user wants to transmit a code block of a length that is not compatible with a supported LDPC code, an LDPC code must be shortened, punctured, and repeated to be made usable. This means that a $(n_2,k_2)$ code with a code rate of $R=k_2/n_2$ must be derived from a $(n_1,k_1)$ code with a code rate of $R=k_1/n_1$.

To derive a $(n_2,k_2)$ code, a code block of $k_2$ bits must first be accepted. Once the code block has been received, $k_1-k_2$ dummy bits must be added to the code block of length $k_2$ to obtain a code block of length $k_1$. At this time, the code block of length $k_2$ has been transformed into a code block of length $k_1$, which enables the use of the existing $(n_1,k_1)$ LDPC code to obtain $n_1$ coded bits.

Once the bits have been encoded, the $k_1-k_2$ dummy bits that were previously added in must be removed from the $n_1$ coded bits. The number of coded bits left after the removal of the dummy bits is $n_1-(k_1-k_2)$ bits. Finally $n_1-(k_1-k_2)-n_2$ bits must be punctured from the remaining coded bits to obtain $n_2$ bits. The process of deriving an LDPC code through shortening, puncturing, and repeating will now be described.

UT2 506 is sending code blocks of 3360 bits at a code rate of 1/2 (i.e., the ratio of information bits to coded bits is 1/2), so the LDPC code that is desired is denoted as (6720/3360). Since the code block does not have a supported LDPC code, it needs to be derived using a mother parity check matrix of a LDPC code that is supported. In this case the existing LDPC code is denoted as (7200/3600).

To begin deriving an LDPC code for a code block of 3360 bits and a rate of 1/2, the 3360 bits are accepted. 240 dummy bits are added to the 3360 information bits to obtain a code block that is 3600 bits in length. Using the supported LDPC code and associated parity check matrix, a code block of 7200 bits is derived.

The 240 dummy bits that were added to the original code block of 3360 bits are still contained within the 7200 bit code block. Removing the dummy bits a code block of 6960 bits is obtained. Since a code block of 6720 bits is desired, another 240 bits must be punctured to obtain 6720 bits as desired. After a code block of 6720 bits has been derived, SPR portion 602 will send the coded bits to gateway 502. Once the code has been received by gateway 502, the code can be reconstructed using the mother parity check matrix to recover the bits that were punctured out of the code block.

In slower code rates such as 1/2, 2/3, and 4/5 the punctured bits should be chosen among the parity bits, whereas for high code rates such as 8/9 and 9/10, punctured bits should be chosen among the systematic bits to minimize performance loss.

Shortening, puncturing, and repeating provides a method for coding and transmitting blocks of an intermediate size. This method allows the transmission of code blocks that may not be associated with a supported mother LDPC code.

In this example, the code block derived is 6720 bits in length, which is larger than the maximum implemented block size of 5720 bits. In this case, more than one code block needs to be sent to transmit all of the user's data. One method would be to transmit a block size of 5760 bits and another block size of 960 bits. This choice, would have poor performance due to the short block size of 960 bits because the shorter the block size the more transmit power per bit is needed. An optimum choice would be two 3360 bit blocks, because reliability and efficiency are optimized. The transmitted block sizes should be chosen such that the minimum transmitted size is maximized. This rule applies even if the number of transmitted block sizes is more than two. In the above example, the two 3360 bit blocks are sent by making use of the 3600 bit mother blocks.

The division of large code blocks in such a way that the minimum transmitted size is maximized will now be discussed further with respect to FIGS. 7A-7B.

Figure 7A:
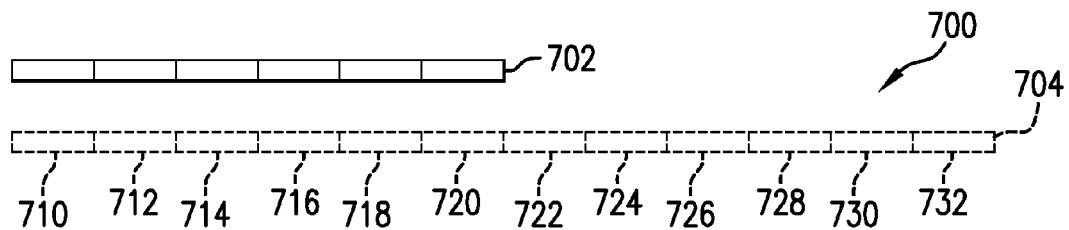
FIG. 7A and FIG. 7B illustrates the optimization of data stream division, where
Figure 7B:
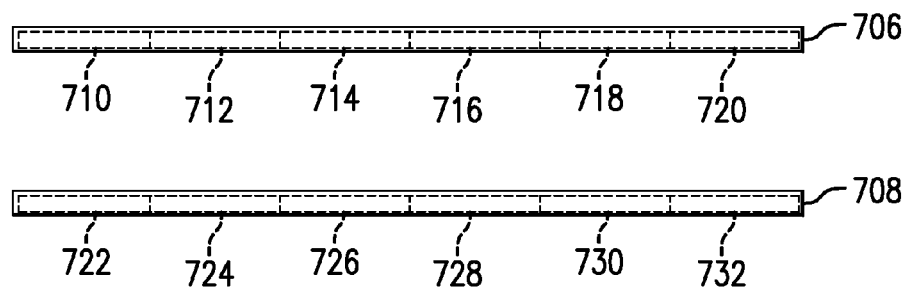

FIG. 7A and FIG. 7B illustrate the transmission of a data stream length that is not supported by receiver hardware in accordance with aspects of the present invention.

As illustrated in FIGS. 7A-7B system 700 includes supported data stream length 702, data stream 704, a data packet 706, and a data packet 708. Supported data stream length 702 is the length of 6 data packets, each of which is 560 bits in length. Data stream 704 is comprised of 12 individual data packets, data packet 710 through data packet 732, each of which is 560 bits in length.

Data packet 706 and data packet 708 can each hold 6 individual packets of data, each of which are 560 bits in length. Data packet 706 and data packet 708 are of the same length as data stream 702, the length of which is supported by the receiver hardware.

Occasionally a user may have an arbitrarily large amount of data to send, it would not be practically feasible to implement arbitrarily large block sizes. This is because the complexity of iterative receivers increases almost linearly with increasing block sizes. On the other hand, performance does not improve indefinitely with increasing block sizes; after every block size increase, the performance (reduction in transmit power per bit) reduces until a point where further block size increase causes negligible performance improvement. Hence, a system design was chosen based on performance and complexity considerations, leading to a maximum supported block size of, for example, 5760 bits.

In operation, data stream 704 is 6720 bits in length, which is too large to fit into the largest supported data packet of 5720 bits. Therefore, data stream 704 needs to be converted into data stream lengths that can be put into packet sizes that are supported by the receiver hardware. Since data stream 704 is too long to fit into a supported data packet size, it needs to be divided into smaller lengths that will fit into a supported data packet size that will then be transmitted.

The division of data stream 704 into smaller lengths to fit into supported data packet sizes will further be discussed in reference to FIG. 7B.

FIG. 7B illustrates an example data stream that has been divided into smaller stream lengths which are able to fit into data packets which are supported by the receiver hardware.

In operation, data stream 704 has been divided into two equal lengths, each of which is small enough to fit into data packet 706 and data packet 708. Data packet 786 and data packet 706 are filled with six individual data packets from data stream 704. Once data packet 706 and data packet 708 are filled with information from data stream 704, they are ready to be transmitted to the receiver.

In this configuration, the transmission of data stream 704 has been optimized in regards to reliability. With concerns relating to reliability, each data packet has equally and fully been filled with information from data stream 704. Elimination of the use of dummy bits provides the best and most reliable form of transmission of information.

Also in this configuration, the transmission of data stream 704 has been optimized in regards to energy consumption. With concerns relating to energy consumption, each data packet has the longest possible length without using dummy bits, because the larger the packets size, the more efficient the transmission.

Once the code blocks being transmitted by a user have been shorten, punctured, and repeated using a mother LDPC code and divided into lengths that are supported by the receiver hardware, gateway 502 is able to transmit the code blocks to its intended destination.

Note that when gateway 502 wants to send data to a user terminal the process is reversed. When gateway 502 wants to send data to a user terminal, it uses an LDPC encoder to encode the data. Once the data is encoded, the encoded code blocks are transmitted to a user terminal, which then decodes the code blocks to obtain the originally transmitted data.

Figure 8A:
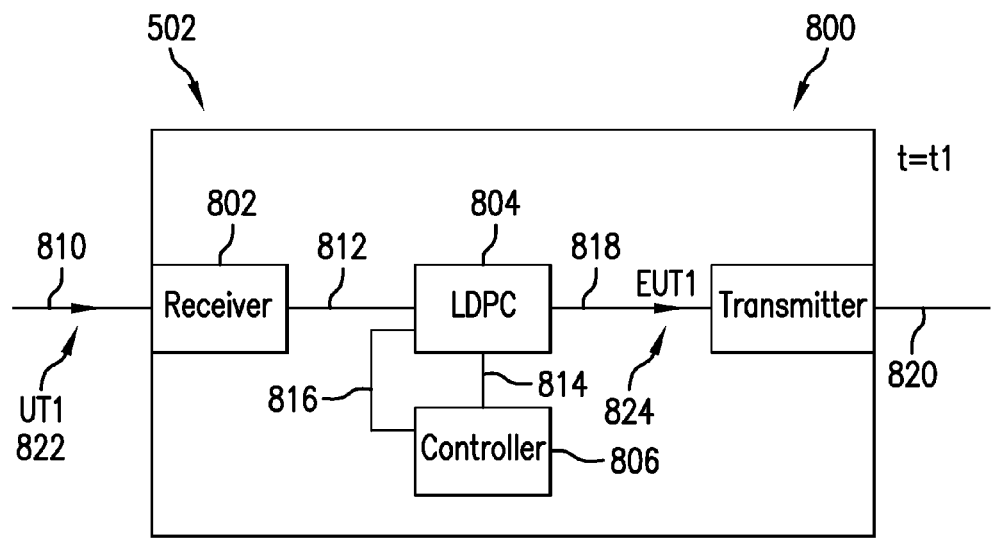
FIG. 8A illustrates the gateway operation at time $t_1$.

FIG. 8A illustrates gateway 502 at time $t_1$ in accordance with aspects of the present invention.

As illustrated in the figure system 800 includes a receiver portion 802, a low density parity check portion (LDPC) 804, a controller 806, and a transmitter 808.

Receiver 802 is arranged to receive incoming data signal 810.

LDPC portion 804 is arranged to receive data via data signal 812 from receiver 802. LDPC portion 804 is additionally arranged to send controller alert 814 to controller 806 and receive enable signal 816. LDPC portion 804 is additionally arranged to send encoded data 818 to transmitter 808.

In operation, encoded data is sent to the encoder by a first user terminal (UT1) 822. UT1 822 reaches the encoder through incoming data signal 810. (Note that there may be a plurality of signals coming in from different user terminals.) At this point LDPC portion 802 decodes the encoded data.

UT1 822 that is received by receiver 802 is sent to LDPC portion 804 via data signal 812. At this point LDPC portion 804 sends controller alert signal 814 to controller 806. Controller alert signal 814 tells controller 806 that LDPC portion 804 has received data and is ready to encode it.

Once alerted that LDPC portion 804 has data that needs to be encoded, controller 806 sends enable signal 816 to LDPC portion 804. Once the signal is received, LDPC portion 804 begins encoding data as described in FIG. 6. Once LDPC portion 804 has encoded the data, it breaks the data up into pieces such that the minimum transmitted size is maximized, then the data is put into packets.

After the data is encoded and put into packets it becomes encoded first user terminal data (EUT1) 824. EUT1 824 is sent to transmitter 808. At this point transmitter 808 sends EUT1 824 to a receiver via Internet connection 820.

Figure 8B:
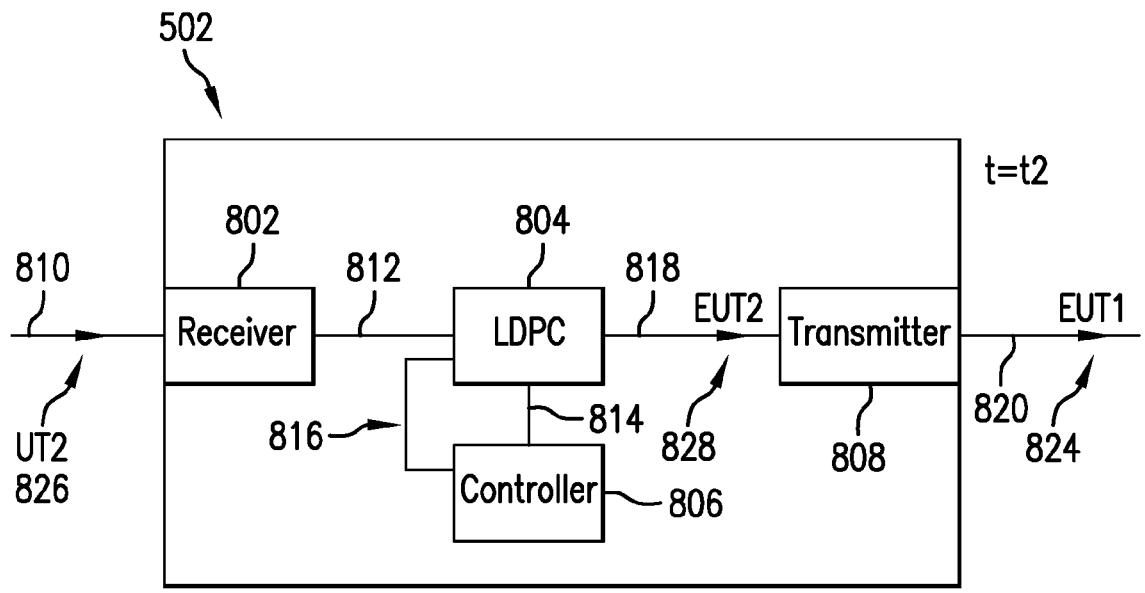
FIG. 8B illustrates the gateway operation at time $t_2$, of the configuration described in FIG. 5, in accordance with aspects of the present invention.

FIG. 8B illustrates gateway 502 at time $t_2$ in accordance with aspects of the present invention.

In operation, system 800 has already received UT1 822, encoded it, and transmitted it as EUT1 824. Now gateway 502 is receiving user terminal 2 data (UT2) 826 via incoming data signal 810.

Gateway 502 follows the same process as before, receiver 802 sends UT2 826 to LDPC 804 via data signal 812. Again, LDPC portion 804 alerts controller 806 via controller alert signal 814, that it has received data and is ready to encode it. Controller 806 then sends enable signal 816 to LDPC portion 804, allowing it to encode UT2 826 and then send it to transmitter 808 as encoded second user terminal data (EUT2) 828.

Again LDPC 804 encodes then breaks up the data into pieces such that the minimum transmitted size is maximized and then puts it into packets to be transmitted. After the data is encoded and put into packets it becomes encoded second user terminal data (EUT2) 828. EUT2 828 is sent to transmitter 808, where EUT2 828 is sent to a receiver via Internet connection 820.

The third aspect of the present invention will now be described in greater detail with reference to FIG. 9.

In accordance with the third aspect, a decoder is provided for use with a first low density parity check code block having a first bit length and a second low density parity check code block having a second bit length. The decoder may store the first low density parity check code block and then use a processing engine to process the stored low density parity check code block based on the address of the first code block. The decoder may store the second low density parity check code block and then use a processing engine to process the stored low density parity check code block based on the address of the second code block.

For example, suppose for purposes of discussion that a decoder in accordance with the third aspect of the present invention includes a first memory portion that contains a first LDPC code block and a second memory portion that contains a second LDPC code block. The decoder will decode the first and second code blocks by using a third LDPC code that is common to both the first and second code blocks.

Figure 9:
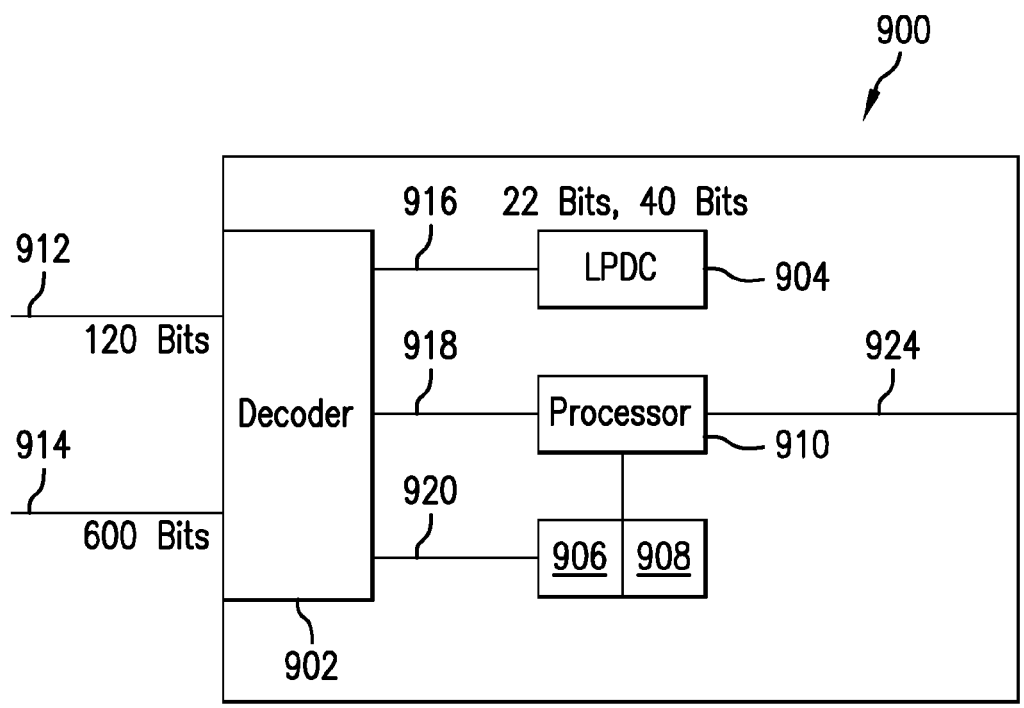
FIG. 9 illustrates the use of common decoder architecture, in accordance with aspects of the present invention.

FIG. 9 illustrates the use of common decoder architecture for different code rates and block sizes in accordance with aspects of the present invention.

As illustrated in the figure system 900 includes, a decoder 902, a LDPC portion 904, an address table 906, an address table 908, and a processor 910.

Decoder 902 is arranged to receive incoming encoded data from signal 912 and signal 914. Decoder 902 is operable to store incoming encoded data in either address table 906 or address table 908.

LDPC portion 904 is arranged to send decoding information to decoder 902.

Address table 906 and address table 908 are arranged to receive and store data sent by decoder 902.

Processor 910 is operable to process information stored in either address table 906 or address table 908. Processor 910 is additionally operable to send data to a receiver via signal 924.

In operation, encoded data is sent to decoder 902 from an outside source (not shown). The encoded data received will be in a length that is supported by the decoder. In this example the block are 120 bits in length and 600 bits in length, but in use incoming data may be in many different supported lengths.

Having architecture to support each different LPDC code takes up valuable space and adds an undesired amount of complexity to hardware design. When code blocks of different lengths are being received by the decoder it searches LPDC portion 904 for a LPDC code that is common among all of the incoming data blocks.

In this example, code block lengths that are supported by LDPC portion 904 are 22 bits and 40 bits in length. Since 22 is not a factor of 120 or 600 it cannot be used, but because 40 is a common factor of both 120 and 600, it can be used to decode the incoming encoded data. Note that in this example LDPC portion 904 only supports two code block lengths but in practice it may support many code block lengths.

Clearly there may not be a need to necessarily find a common factor of 120 and 600. For purposes of discussion, consider that a 120 bit block has an LDPC code rate of 4/5, such that it has 120 bit nodes and 24 check nodes. Some common factor of 120 and 24 should be found. Suppose the number 24 is chosen. In such a case, 24 hardware processing engines may be implemented that will process 120 bit nodes and 24 check nodes.

Now, consider that a 600 bit block has an LDPC code rate of 9/10, such that it has 600 bit nodes and 60 check nodes. In such a case, 60 hardware processing engines may be implemented to process this code. However, 60 hardware processing engines may not be a very good choice. In particular, once 60 processing engines are implemented in hardware, if an LDPC code rate of 4/5 is desired to be supported for a 120 bit block, then 36 of the 60 hardware processing engines would be idle.

To prevent this idle hardware processing engine problem, maybe 30 engines would be a better choice for an LDPC code rate of 9/10 for a 600 bit code, because then only 6 hardware processing engines would be idle for the LDPC code rate of 4/5 for a 120 bit block. Of course another point to consider is that as the number of engines increases, the decoder speed increases. Assuming that all the codes need a similar decoder speed, it is advantageous to choose the number of parallel engines similar for all codes, so that only a few engines stay idle in the hardware.

At this time decoder 902 sends the encoded data that is 120 bits in length to address table 906 and it sends encoded data that is 600 bits in length to address table 908. Code blocks of different lengths are sent to different address tables because a different matrix is used to decode each respective code block.

The parity check matrix used to encode code blocks 120 bits in length is also used to decode code blocks that are 120 bits in length. The parity check matrix used to encode code blocks 600 bits in length is also used to decode 600 bits in length. Segregating code blocks in to address tables for each length indicates to processor 910 which decoding matrix should be used.

Simultaneously decoder 902 sends the common LDPC code to processor 910 which will be used to decode the encoded information stored in address table 906 and address table 908.

Processing engine 910 takes encoded data from address table 906, which is 120 bits in length, and begins decoding the data. Since the LDPC decoding information is smaller than the block sizes stored, it must run the encoded data through an iterative process. With a 40 bit LDPC code, 120 bit code blocks must be run through the decoding process 3 times.

If processing engine 910 is decoding encoded data from address table 908, which is 600 bits in length, it must run the code blocks through an iterative process 15 times.

Once processing engine 910 has decoded the data from address table 906 and address table 908 it can send the data to a receiver (not shown) via signal 924.

As described above, using a common LDPC code to decode data of various lengths can be done while using common architecture. In previous methods, architecture was needed for each separate LDPC code, which added unwanted complexity to the hardware design.

System 500, in accordance with aspects of the present invention, provides a method for large block and intermediate block size support as well as a means for using common decoder architecture for different code rates and block size.

Another benefit of the present invention can be observed with respects to system 700 and system. In this system, the transmission of code blocks which are unsupported by an encoder, is made possible by the shortening, puncturing, and repeating of bits in the code blocks. This reduces the number of supported LDPC codes that need to be implemented.

A benefit of the present invention can be seen when looking at configuration 800. With these configurations, transmission of data has been optimized in regards to reliability and energy consumption. Optimization is achieved by choosing the transmitted block sizes such that the minimum transmitted size is maximized.

The final benefit of the present invention can be seen with respects to system 900. Using a common LDPC code to decode data of various lengths can be done while using a common piece of architecture. In previous methods, architecture was needed for each separate LDPC code, which added unwanted complexity to the hardware design.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method comprising:
   receiving a first string of data bits of a length $k_2$ bits; and
   encoding the first string of data bits to generate a code block of a length $N_2$ bits for transmission over a channel of a wireless communications network;
   wherein the first string of data bits is encoded based on a supported $(N_1,k_1)$ forward error correction (FEC) code of a code rate $R=k_1/N_1$ configured to encode a string of data bits of a length $k_1$ bits to generate a code block of a length $N_1$ bits; and
   wherein, to facilitate the encoding of the first string of data bits based on the $(N_1,k_1)$ FEC code, the encoding comprises one or more of padding, repeating and puncturing the first string of data bits and a resulting $N_1$ bit code block to generate the $N_2$ bit code block.

2. The method of claim 1, wherein $k_2<k_1$, and wherein the encoding comprises adding a number $x_1$ of pad bits to the first string of data bits to generate a second string of data bits of a length $k_1$, encoding the second string of data bits based on the $(N_1,k_1)$ FEC code to generate the resulting $N_1$ bit code block, and removing or puncturing bits from the $N_1$ bit code block to generate the $N_2$ bit code block.

3. The method of claim 2, wherein the removing or puncturing of bits from the $N_1$ bit code block comprises removing the $x_1$ pad bits from the $N_1$ bit code block and puncturing a number $x_2$ of bits from the $N_1$ bit code block to generate the $N_2$ bit code block.

4. The method of claim 3, wherein the number of pad bits removed from the $N_1$ bit code block, $x_1=k_1-k_2$, and the number of bits punctured from the $N_1$ bit code block, $x_2=N_1-x_1-N_2$.

5. The method of claim 1, wherein the FEC code comprises a low density parity check (LDPC) code.

6. The method of claim 5, wherein:
   for an LDPC code of a code rate R equal to one of the group consisting of 1/2, 2/3, 4/5, 3/4 and 5/6, the punctured bits are punctured from parity bits of the $N_1$ bit code block; and
   for an LDPC code of a code rate R equal to one of the group consisting of 8/9 and 9/10, the punctured bits are punctured from data bits of the $N_1$ bit code block.

7. The method of claim 1, wherein the supported $(N_1,k_1)$ FEC code is a one of a plurality of supported FEC codes, each being a different $(N,k)$ code of a respective code rate $R=k/N$ configured to encode a string of data bits of a length k bits to generate a code block of a length N bits, and the length $k_2$ of the first string of data bits does not correspond to any of the supported FEC codes, and wherein the method further comprises:
   selecting the $(N_1,k_1)$ FEC code as the one of the plurality of supported FEC codes with respect to which the length $N_1$ of the resulting $N_1$ bit code block reflects a bit length that is a next size larger than the length $N_2$ of the $N_2$ bit code block.

8. An apparatus comprising an encoder, wherein:
   the encoder includes an input port configured to receive a string of input data bits;
   the encoder is configured to encode the string of input data bits to generate a resulting code block for transmission over a channel of a wireless communications network, and the encoder supports one or more forward error correction (FEC) codes, each supported FEC code being a different $(N,k)$ code of a respective code rate $R=k/N$ configured to encode a string of data bits of a length k bits to generate a code block of a length N bits; and
   in a case where the received string of information bits is of a length of $k_2$ bits, and the bit length $k_2$ does not correspond to any of the supported FEC codes, the encoder is configured to encode the received string of data bits to generate a code block of a length $N_2$ bits, wherein
   the received string of data bits is encoded based on a one of the supported FEC codes $(N_1,k_1)$, of a code rate $R=k_1/N_1$ and configured to encode a string of data bits of a length $k_1$ bits to generate a code block of a length $N_1$ bits, and
   to facilitate the encoding of the received string of data bits based on the $(N_1,k_1)$ FEC code, the encoding comprises one or more of padding, repeating and puncturing the first string of data bits and a resulting $N_1$ bit code block to generate the $N_2$ bit code block.

9. The apparatus of claim 8, wherein $k_2<k_1$, and wherein the encoding comprises adding a number $x_1$ of pad bits to the received string of data bits to generate a second string of data bits of a length $k_1$, encoding the second string of data bits based on the $(N_1,k_1)$ FEC code to generate the resulting $N_1$ bit code block, and removing or puncturing bits from the $N_1$ bit code block to generate the $N_2$ bit code block.

10. The apparatus of claim 9, wherein the removing or puncturing of bits from the $N_1$ bit code block comprises removing the $x_1$ pad bits from the $N_1$ bit code block and puncturing a number $x_2$ of bits from the $N_1$ bit code block to generate the $N_2$ bit code block.

11. The apparatus of claim 10, wherein the number of pad bits removed from the $N_1$ bit code block, $x_1 = k_1 - k_2$, and the number of bits punctured from the $N_1$ bit code block, $x_2 = N_1 - x_1 - N_2$.

12. The apparatus of claim 8, wherein the FEC code comprises a low density parity check (LDPC) code.

13. The apparatus of claim 12, wherein:
for an LDPC code of a code rate R equal to one of the group consisting of 1/2, 2/3, 4/5, 3/4 and 5/6, the punctured bits are punctured from parity bits of the $N_1$ bit code block; and
for an LDPC code of a code rate R equal to one of the group consisting of 8/9 and 9/10, the punctured bits are punctured from data bits of the $N_1$ bit code block.

14. The apparatus of claim 8, wherein the encoder is further configured to select the $(N_1, k_1)$ FEC code as the one of the supported FEC codes with respect to which the length $N_1$ of the resulting $N_1$ bit code block reflects a bit length that is a next size larger than the length $N_2$ of the $N_2$ bit code block.

* * * * *